(12) United States Patent
Nate

(10) Patent No.: US 11,722,063 B2
(45) Date of Patent: Aug. 8, 2023

(54) SEMICONDUCTOR DEVICE AND ISOLATED SWITCHING POWER SUPPLY

(71) Applicant: Rohm Co., Ltd., Kyoto (JP)

(72) Inventor: Satoru Nate, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 99 days.

(21) Appl. No.: 17/499,171

(22) Filed: Oct. 12, 2021

(65) Prior Publication Data

US 2022/0115942 A1 Apr. 14, 2022

(30) Foreign Application Priority Data

Oct. 12, 2020 (JP) ................................. 2020-172108

(51) Int. Cl.
*H02M 1/32* (2007.01)
*H02M 1/08* (2006.01)
*H02M 3/335* (2006.01)
*H03K 17/082* (2006.01)
*H03K 17/18* (2006.01)

(52) U.S. Cl.
CPC ............... *H02M 1/08* (2013.01); *H02M 1/32* (2013.01); *H02M 3/33507* (2013.01); *H02M 3/33576* (2013.01); *H03K 17/0822* (2013.01); *H03K 17/18* (2013.01)

(58) Field of Classification Search
CPC .......... H02M 1/08; H02M 1/32; H02M 1/088; H02M 3/33507; H03K 17/0822; H03K 17/18
See application file for complete search history.

(56) References Cited

U.S. PATENT DOCUMENTS

| 5,621,601 A | * | 4/1997 | Fujihira | ............. H03K 17/0822 361/115 |
| 2012/0169309 A1 | * | 7/2012 | Zhang | ...................... H02M 1/32 323/271 |
| 2016/0118890 A1 | * | 4/2016 | Yamada | ................... H02M 1/32 318/490 |
| 2021/0143810 A1 | * | 5/2021 | Takuma | ............. H03K 17/0822 |

FOREIGN PATENT DOCUMENTS

JP 2009-095224 4/2009

* cited by examiner

*Primary Examiner* — Kyle J Moody
*Assistant Examiner* — Jye-June Lee
(74) *Attorney, Agent, or Firm* — Fish & Richardson P.C.

(57) ABSTRACT

There is provided a semiconductor device that includes a switch terminal; a ground terminal; an output switch connected between the switch terminal and the ground terminal and configured to be switchable between a first on-resistance value and a second on-resistance value higher than the first on-resistance value; a detection circuit configured to detect a short-circuit abnormality of the switch terminal by monitoring a switch voltage that appears at the switch terminal in a predetermined detection period; and a controller configured to perform a pulse-drive of the output switch by setting the output switch to the second on-resistance value in the detection period, continuously perform the pulse-drive of the output switch by setting the output switch to the first on-resistance value if the short-circuit abnormality of the switch terminal is not detected, and forcibly stop the pulse-drive of the output switch if the short-circuit abnormality of the switch terminal is detected.

10 Claims, 7 Drawing Sheets

SEMICONDUCTOR DEVICE AND ISOLATED SWITCHING POWER SUPPLY

CROSS-REFERENCE TO RELATED APPLICATION(S)

This application is based upon and claims the benefit of priority from Japanese Patent Application No. 2020-172108, filed on Oct. 12, 2020, the entire contents of which are incorporated herein by reference.

TECHNICAL FIELD

The present disclosure relates to a semiconductor device and an isolated switching power supply using the same.

BACKGROUND

In the related art, an isolated switching power supply (e.g., flyback power supply) is installed in a variety of applications including vehicles.

However, there is room for further improvement in the safety of a conventional isolated switching power supply (particularly, a semiconductor device as a main control body thereof).

SUMMARY

Some embodiments of the present disclosure provide a highly safe semiconductor device and an isolated switching power supply using the same.

According to one embodiment of the present disclosure, there is provided a semiconductor device that includes a switch terminal; a ground terminal; an output switch connected between the switch terminal and the ground terminal and configured to be switchable between a first on-resistance value and a second on-resistance value higher than the first on-resistance value; a detection circuit configured to detect a short-circuit abnormality of the switch terminal by monitoring a switch voltage that appears at the switch terminal in a predetermined detection period; and a controller configured to perform a pulse-drive of the output switch by setting the output switch to the second on-resistance value in the detection period, continuously perform the pulse-drive of the output switch by setting the output switch to the first on-resistance value if the short-circuit abnormality of the switch terminal is not detected, and forcibly stop the pulse-drive of the output switch if the short-circuit abnormality of the switch terminal is detected.

According to another embodiment of the present disclosure, there is provided a semiconductor device, wherein the detection period is set when electric power is supplied to the semiconductor device or when a predetermined trigger is inputted.

According to another embodiment of the present disclosure, there is provided a semiconductor device, wherein the output switch is formed by connecting a plurality of transistors in parallel.

According to another embodiment of present disclosure, there is provided a semiconductor device, wherein the detection circuit includes a comparator configured to generate a detection signal by comparing the switch voltage or a voltage corresponding thereto with a predetermined threshold voltage.

According to another embodiment of present disclosure, there is provided a semiconductor device, wherein the short-circuit abnormality of the switch terminal is detected when the logic level of the detection signal is fixed to one logic level.

According to another embodiment of present disclosure, there is provided a semiconductor device, wherein the detection circuit includes: a first comparator configured to generate a first comparison signal by comparing the switch voltage or a voltage corresponding thereto with a first threshold voltage; a second comparator configured to generate a second comparison signal by comparing the switch voltage or a voltage corresponding thereto with a second threshold voltage higher than the first threshold voltage; and a logic part configured to generate a detection signal according to both the first comparison signal and the second comparison signal.

According to another embodiment of present disclosure, there is provided a semiconductor device, wherein the short-circuit abnormality of the switch terminal is detected when both the first comparison signal and the second comparison signal are fixed to one logic level.

According to another embodiment of present disclosure, there is provided a semiconductor device, wherein the first threshold voltage is generated by giving a positive offset to a low level of the switch voltage, and the second threshold voltage is generated by giving a negative offset to a high level of the switch voltage.

According to another embodiment of present disclosure, there is provided an isolated switching power supply that includes the semiconductor device; a transformer configured such that a primary winding of the transformer is connected in series between an application end of a DC input voltage and the switch terminal of the semiconductor device; and a rectifying/smoothing circuit configured to generate a DC output voltage by rectifying and smoothing an induced voltage appearing in a secondary winding of the transformer.

According to another embodiment of present disclosure, there is provided a vehicle comprising the isolated switching power supply.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In the present disclosure, "a state where a member A is connected to a member B" includes a case where the member A and the member B are physically directly connected or even a case where the member A and the member B are indirectly connected through any other member that does not affect an electrical connection state between the members A and B or does not impair functions and effects achieved by combinations of the members A and B.

First Embodiment

<(Comparative Example)>

Figure 1:
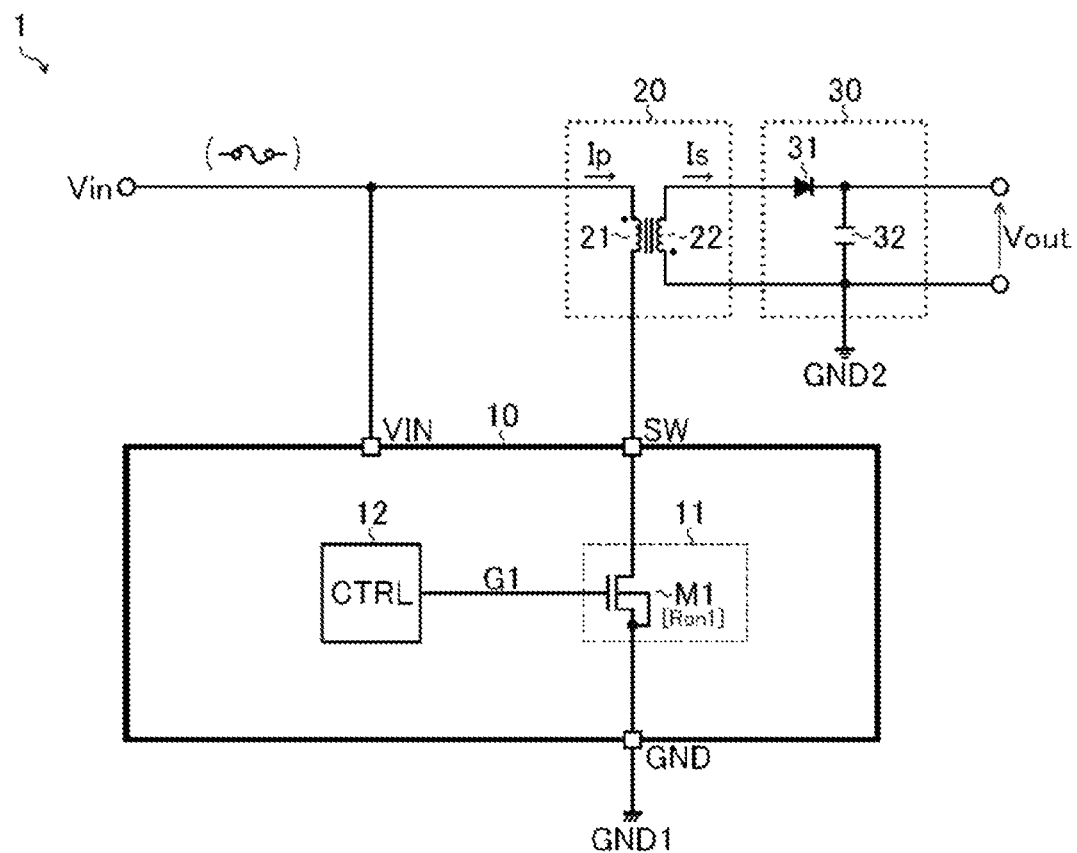
FIG. 1 shows a first embodiment (comparative example) of an isolated switching power supply.

FIG. 1 shows a first embodiment of an isolated switching power supply (corresponding to a comparative example to be compared with a second embodiment and a third embodiment described later). The isolated switching power supply 1 of the present embodiment is a flyback power supply that converts a DC input voltage Vin supplied to a primary circuit system into a desired DC output voltage Vout and supplies the DC output voltage Vout to a secondary circuit system, while electrically insulating the primary circuit system (GND1 system) and the secondary circuit system (GND2 system) from each other. The isolated switching power supply 1 includes a semiconductor device 10, a transformer 20, and a rectifying/smoothing circuit 30.

A rectifier circuit (diode bridge or the like), in which an AC input voltage Vac is supplied to the isolated switching power supply 1 and the AC input voltage Vac is converted into the DC input voltage Vin, may be provided in the preceding stage.

The semiconductor device 10 is a so-called power supply control IC, which is provided in the primary circuit system to serve as a controller of the isolated switching power supply 1. The semiconductor device 10 includes a power supply terminal VIN, a switch terminal SW, and a ground terminal GND, which serve to establish electrical connections with the outside of the semiconductor device 10. The power supply terminal VIN is connected to an application end of the DC input voltage Vin. The switch terminal SW is connected to the transformer 20 (particularly, a primary winding 21 described later). The ground terminal GND is connected to a ground end GND1 of the primary circuit system. The semiconductor device 10 may also be appropriately provided with external terminals in addition to the above terminals, if necessary. The internal configuration of the semiconductor device 10 is described later.

The transformer 20 includes a primary winding 21 (having the number of turns Np) and a secondary winding 22 (having the number of turns Ns) that are magnetically coupled to each other while electrically insulating the primary circuit system and the secondary circuit system from each other. A first end (winding start end) of the primary winding 21 is connected to the application end of the DC input voltage Vin. A second end (winding finish end) of the primary winding 21 is connected to the switch terminal SW of the semiconductor device 10. In this way, the primary winding 21 is connected in series between the application end of the DC input voltage Vin and the switch terminal SW of the semiconductor device 10. On the other hand, a first end (winding finish end) of the secondary winding 22 is connected to an input end of the rectifying/smoothing circuit 30 (an anode of a diode 31 described later). A second end (winding start end) of the secondary winding 22 is connected to a ground end GND2 of the secondary circuit system.

The numbers of turns Np and Ns of the transformer 20 may be adjusted appropriately to obtain the desired DC output voltage Vout ($=V_{in} \times (N_s/N_p) \times (T_{on}/T_{off})$, where Ton and Toff are an on-period and an off-period of an output switch 11 described later). For example, the larger the number of turns Np is or the smaller the number of turns Ns is, the lower the DC output voltage Vout is. By contrast, the smaller the number of turns Np is or the larger the number of turns Ns is, the higher the DC output voltage Vout is.

The rectifying/smoothing circuit 30 includes a diode 31 and a capacitor 32 provided in the secondary circuit system. The rectifying/smoothing circuit 30 rectifies and smooths an induced voltage appearing in the secondary winding 22 of the transformer 20 to generate the DC output voltage Vout. An anode of the diode 31 is connected to the first end (winding finish end) of the secondary winding 22. A cathode of the diode 31 and a first end of the capacitor 32 are connected to the output end of the DC output voltage Vout. A second end of the capacitor 32 is connected to the ground end GND2 of the secondary circuit system.

<Semiconductor Device (Basic Configuration)>

Subsequently, the internal configuration (basic configuration) of the semiconductor device 10 is described with reference to FIG. 1. The semiconductor device 10 of this configuration example includes an output switch 11 and a controller 12. Other components (various protection circuits and the like) in addition to the above ones may be appropriately integrated in the semiconductor device 10 as needed.

The output switch 11 is a switch element that turns on or off a primary current Ip flowing through the primary winding 21 by connecting or disconnecting a current path, which goes from the application end of the DC input voltage Vin to the ground end GND1 of the primary circuit system via the primary winding 21 of the transformer 20, in response to a gate signal G1. When an N-channel MOS (Metal Oxide Semiconductor) field effect transistor M1 is used as the output switch 11, the drain of the transistor M1 is connected to the switch terminal SW and the source of the transistor M1 is connected to the ground terminal GND. In this case, the output switch 11 is turned on when the gate signal G1 is at a high level, and the output switch 11 is turned off when the gate signal G1 is at a low level.

The controller 12 receives an input of an output feedback signal (not shown) and performs a duty control of the gate signal G1 so that the DC output voltage Vout becomes a desired target value. The controller 12 also has a function as a driver for generating the gate signal G1.

<Basic Operation>

A basic operation of the isolated switching power supply 1 is briefly explained. During an on-period Ton of the output switch 11, the primary current Ip flows from the application end of the DC input voltage Vin to the ground end GND1 through the primary winding 21 and the output switch 11. Therefore, electrical energy is stored in the primary winding 21.

Thereafter, when the output switch 11 is turned off, an induced voltage is generated in the secondary winding 22 magnetically coupled to the primary winding 21. A secondary current Is flows from the secondary winding 22 to the ground end GND2 via the diode 31 and the capacitor 32. At this time, the DC output voltage Vout obtained by rectifying and smoothing the induced voltage of the secondary winding 22 is supplied to a load (not shown).

Thereafter, the same switching output operation as described above is repeated as the output switch 11 is turned on and off.

As described above, according to the isolated switching power supply 1 of the present embodiment, the desired DC output voltage Vout can be generated from the DC input voltage Vin while electrically insulating the primary circuit system and the secondary circuit system from each other.

<Consideration on Transformer Short-Circuit>

In the isolated switching power supply 1 of the present embodiment, when short-circuit occurs on the primary side of the transformer 20 (=between both ends of the primary winding 21), an excessive primary current Ip flows during the on-period Ton of the output switch 11, whereby the semiconductor device 10 may be destroyed.

As a workaround solution, for example, a fuse may be connected between the application end of the DC input voltage Vin and the primary winding 21 of the transformer 20 so that when an excessive primary current Ip is generated, the fuse can be melted and cut to protect a subsequent circuit.

However, in the isolated switching power supply 1 that deals with a large electric power (several kW), the output switch 11 may be destroyed even for a moment (several hundred ns) until the fuse is melt and cut. In the following, a new embodiment capable of solving such a problem is proposed.

Second Embodiment

Figure 2:
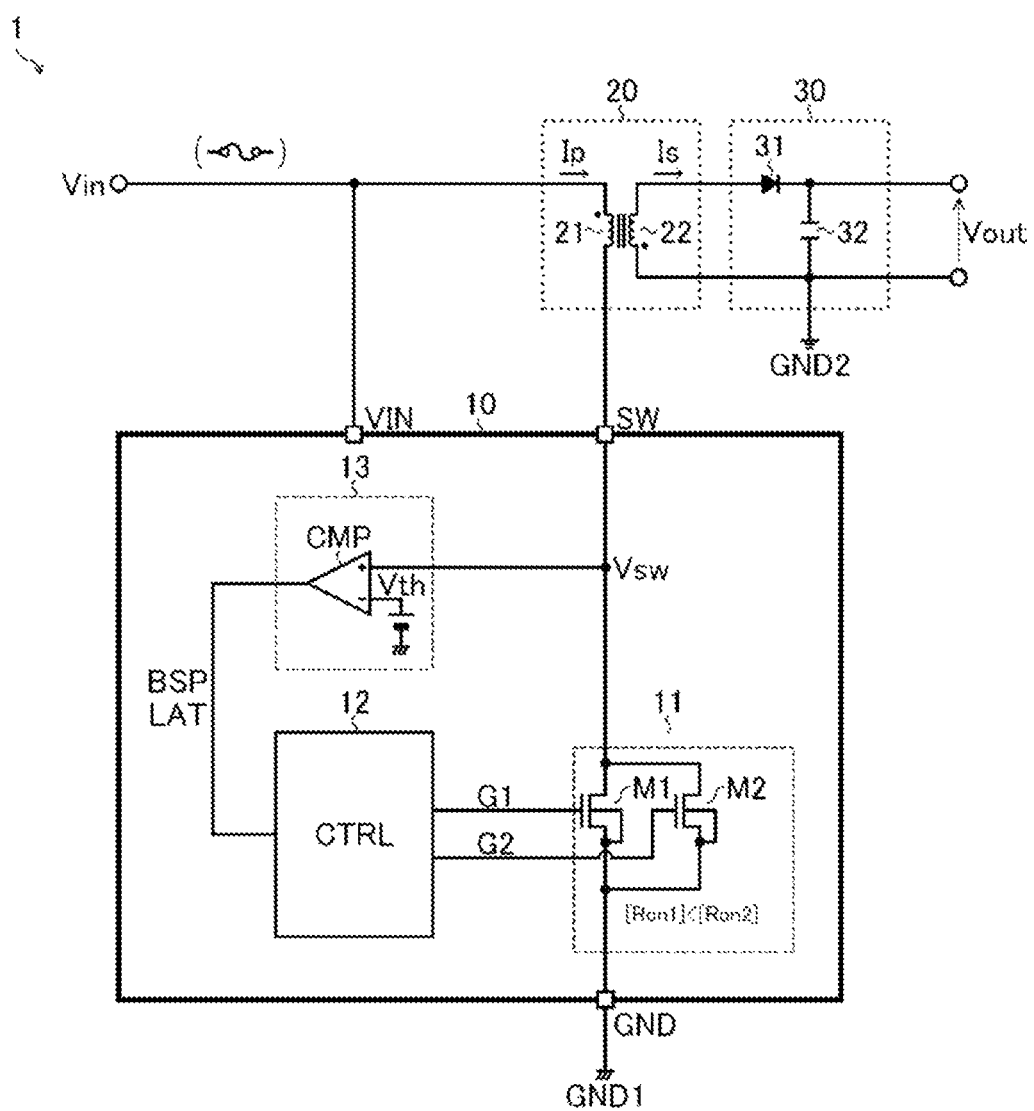
FIG. 2 shows a second embodiment of an isolated switching power supply.

FIG. 2 shows a second embodiment of an isolated switching power supply. The isolated switching power supply 1 of the present embodiment is based on the first embodiment (FIG. 1) described above and is changed in the internal configuration of the semiconductor device 10.

First, the output switch 11 is formed by connecting two N-channel type MOS field effect transistors M1 and M2 (having on-resistance values Ron1 and Ron2, where Ron1<Ron2) in parallel, and can be switched to one of a first on-resistance value (low resistance value) for a normal operation and a second on-resistance value (high resistance value) for a short-circuit detection operation.

As described above, the transistor M1 is turned on when the gate signal G1 is at a high level, and the transistor M1 is turned off when the gate signal G1 is at a low level. On the other hand, the transistor M2 is turned on when the gate signal G2 is at a high level, and the transistor M2 is turned off when the gate signal G2 is at a low level.

For example, during the normal operation of the semiconductor device 10, the transistor M1 is turned on and the transistor M2 is turned off in the on-period Ton of the output switch 11, so that the output switch 11 can be set to the first on-resistance value (=on-resistance value Ron1 of the transistor M1). In order to reduce the first on-resistance value of the output switch 11 as much as possible, both the transistors M1 and M2 may be turned on in the on-period Ton of the output switch 11. In this case, the first on-resistance value of the output switch 11 becomes a combined on-resistance value (=Ron1//Ron2) of the transistors M1 and M2.

On the other hand, for example, during the short-circuit detection operation of the semiconductor device 10 (=detection period T1 described later), the transistor M1 is turned off and the transistor M2 is turned on in the on-period Ton of the output switch 11, so that the output switch 11 can be set to a second on-resistance value (=on-resistance value Ron2 of the transistor M2) higher than the first on-resistance value.

Further, the semiconductor device 10 is formed by further integrating a detection circuit 13 configured to detect a short-circuit abnormality of the switch terminal SW (=short-circuit between both ends of the primary winding 21) by monitoring a switch voltage Vsw appearing on the switch terminal SW in a predetermined detection period T1 which is set when electric power is supplied or when a trigger is inputted (e.g., when an enable signal EN described later is inputted).

Describing with reference to this figure, the detection circuit 13 includes a comparator CMP configured to generate a detection signal BSPLAT by comparing a switch voltage Vsw (or a corresponding voltage) inputted to a non-inverting input terminal (+) with a predetermined threshold voltage Vth inputted to an inverting input terminal (−). The detection signal BSPLAT is, for example, a binary signal that has a high level when Vsw>Vth and a low level when Vsw<Vth. The detection signal BSPLAT is inputted to the controller 12.

The controller 12 performs a pulse-drive of the output switch 11 by setting the output switch 11 to the second on-resistance value (=Ron2) in a predetermined detection period T1 (e.g., 100 μm). When the short-circuit abnormality of the switch terminal SW is not detected, the controller 12 continuously perform the pulse-drive of the output switch 11 by setting the output switch 11 to the first on-resistance value (=Ron1 or Ron1//Ron2). On the other hand, when the short-circuit abnormality of the switch terminal SW is detected, the controller 12 forcibly stops the pulse-drive of the output switch 11. Hereinafter, the details are described with reference to the drawings.

Figure 3:
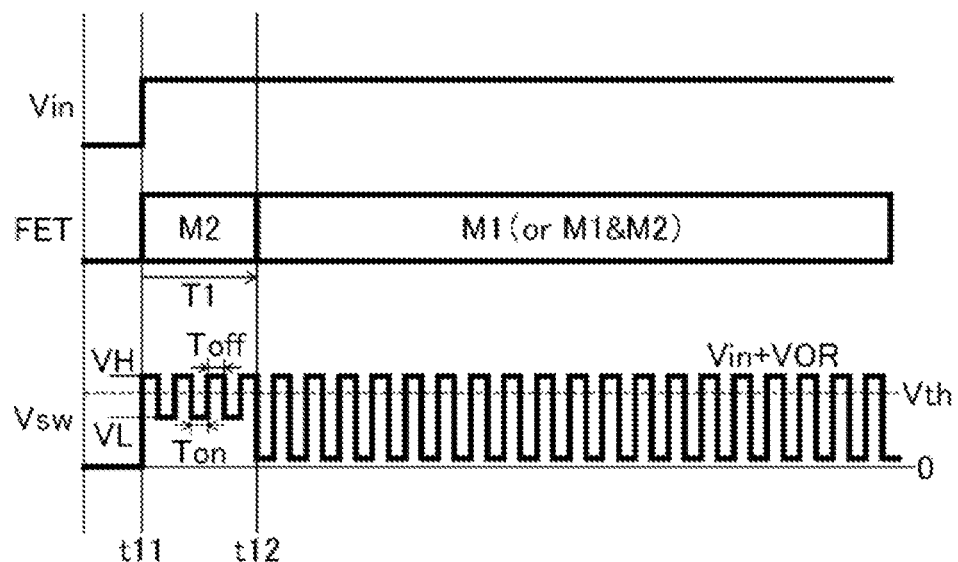
FIG. 3 shows a first example (normal time) of a short-circuit detection operation in the second embodiment.

FIG. 3 is a timing chart showing a first example (=when the switch terminal SW is in a normal state) of the short-circuit detection operation in the second embodiment. In FIG. 3, a DC input voltage Vin, a pulse-drive target FET of the output switch 11, and a switch voltage Vsw are depicted sequentially from above.

When the DC input voltage Vin is applied to the semiconductor device 10 at time t11, a short-circuit detection operation of the switch terminal SW is performed over a predetermined detection period T1 (=t11 to t12). With reference to this figure, only the transistor M2 is pulse-driven while the transistor M1 is turned off in the above-mentioned short-circuit detection operation. That is, during the short-circuit detection operation of the switch terminal SW, the output switch 11 is turned on and off while being set to the second on-resistance value (=Ron2).

At this time, if there is no short-circuit abnormality of the switch terminal SW (=short-circuit between both ends of the primary winding 21), according to the on/off state of the output switch 11, the switch voltage Vsw fluctuates up and down between a high level VH (=Vin+VOR, where VOR is a flyback voltage, and VOR=Vout×Np/Ns) and a low level VL (=Vin×Ron2/(DCR+Ron2), where DCR is a DC resistance component of the primary winding 21).

Therefore, by setting a threshold voltage Vth in advance so that VL<Vth<VH, when the switch terminal SW is in the normal state, the detection signal BSPLAT is in a state of periodically repeating the high level and the low level. Therefore, the controller 12 can determine that the switch terminal SW is normal by detecting that the detection signal BSPLAT is periodically falling to a low level.

If the short-circuit abnormality of the switch terminal SW is not detected, the normal operation of the semiconductor device 10 is started at time t12, and the transistor M1 (or both the transistors M1 and M2) is pulse-driven. That is, during the normal operation of the semiconductor device 10, the output switch 11 is turned on and off while being set to the first on-resistance value (=Ron1 or Ron1//Ron2).

Figure 4:
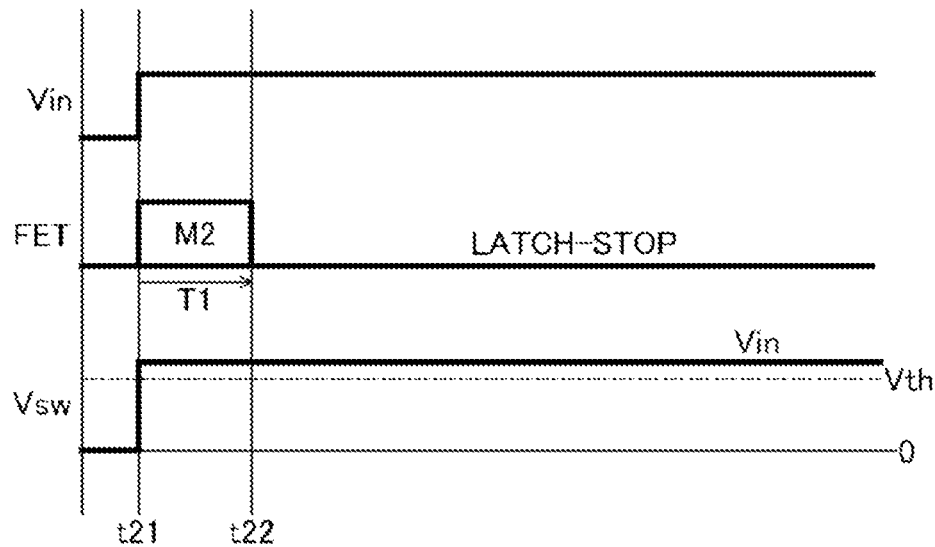
FIG. 4 shows a second example (abnormal time) of the short-circuit detection operation in the second embodiment.

FIG. 4 is a timing chart showing a second example (=when the switch terminal SW is in an abnormal state) of the short-circuit detection operation in the second embodiment. As in FIG. 3, a DC input voltage Vin, a pulse-drive target FET of the output switch 11, and a switch voltage Vsw are depicted sequentially from above.

When the DC input voltage Vin is applied to the semiconductor device 10 at time t21, a short-circuit detection operation of the switch terminal SW is performed over a predetermined detection period T1 (=t21 to t22). In the short-circuit detection operation as described above, only the transistor M2 is pulse-driven while the transistor M1 is turned off. That is, during the short-circuit detection operation of the switch terminal SW, the output switch 11 is turned on and off while being set to the second on-resistance value (=Ron2).

At this time, if a short-circuit abnormality of the switch terminal SW (=short-circuit between both ends of the primary winding 21) occurs, the switch voltage Vsw is substantially fixed to the DC input voltage Vin regardless of whether the output switch 11 is turned on or off. Accordingly, when the switch terminal SW is in the abnormal state, the detection signal BSPLAT is fixed at a high level. Therefore, the controller 12 can determine the abnormality of the switch terminal SW by detecting that the detection signal BSPLAT is fixed at one logic level (in other words, the detection signal BSPLAT does not periodically fall to a low level).

During the short-circuit detection operation, the primary current Ip flows directly from the application end of the DC input voltage Vin toward the output switch 11. However, since the on-resistance value of the output switch 11 is higher than that during the normal operation, it is possible to reduce the power consumption (as a result, the heating amount) in the output switch 11.

When the short-circuit abnormality of the switch terminal SW is detected, at time t22 after the detection period T1 expires, the pulse-drive of the output switch 11 is forcibly stopped without starting the normal operation of the semiconductor device 10. Therefore, since the excessive primary current Ip can be cut off, it is possible to enhance the safety of the semiconductor device 10.

Third Embodiment

Figure 5:
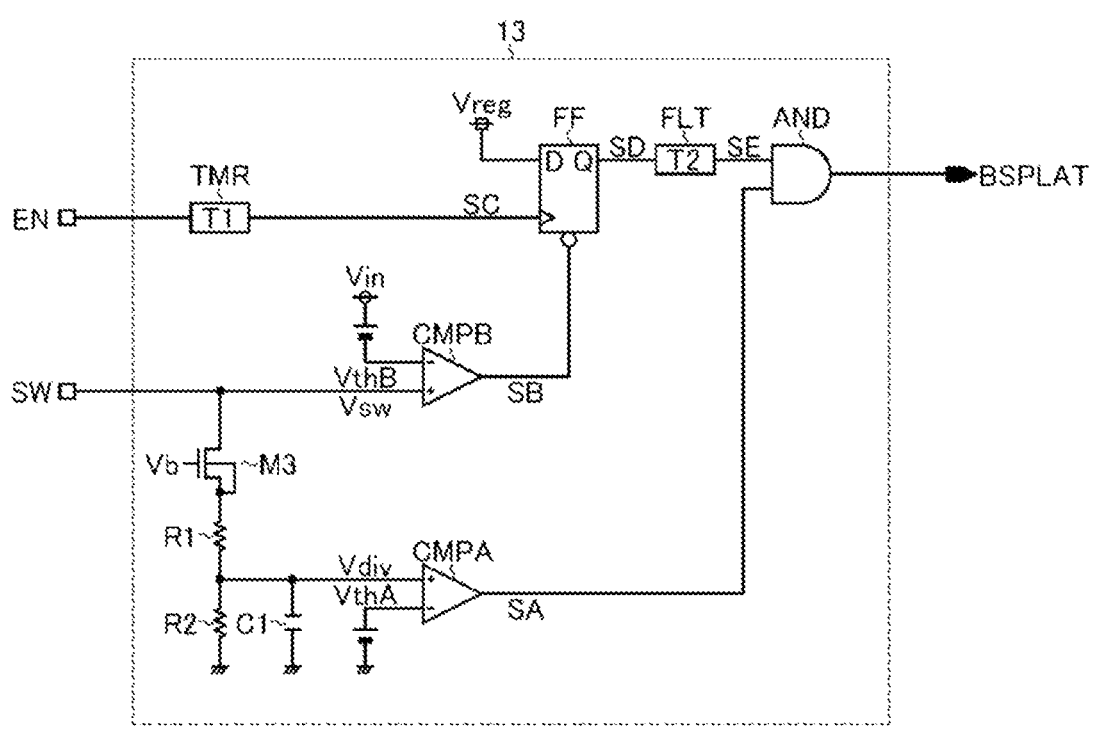
FIG. 5 shows a third embodiment of an isolated switching power supply.

FIG. 5 shows a third embodiment of an isolated switching power supply (particularly, a modification of the detection circuit 13). In the isolated switching power supply 1 of the present embodiment, the detection circuit 13 includes comparators CMPA and CMPB, a timer TMR, a D flip-flop FF, a filter FLT, a logical product calculator AND, an N-channel type MOS field effect transistor M3, resistors R1 and R2, and a capacitor C1.

The comparator CMPA is a first comparator for detecting whether the switch terminal SW is shorted, for example, to an operating voltage of a power supply. The comparator CMPA generates a comparison signal SA by comparing a divided voltage Vdiv (=voltage corresponding to the switch voltage Vsw) inputted to a non-inverting input end (+) and a threshold voltage VthA inputted to an inverting input terminal (−). The comparison signal SA becomes a high level when Vdiv>VthA and becomes a low level when Vdiv<VthA. The threshold voltage VthA may be generated by giving a positive offset to the low level (GND1) of the switch voltage Vsw.

The comparator CMPB is a second comparator (corresponding to the comparator CMP mentioned above) for detecting whether the switch terminal SW is normally pulse-driven. The comparator CMPB generates a comparison signal SB by comparing a switch voltage Vsw inputted to a non-inverting input end (+) and a threshold voltage VthB inputted to an inverting input terminal (−). The comparison signal SB becomes a high level when Vsw>VthB and becomes a low level when Vsw<VthB. The threshold voltage VthB may be generated by giving a negative offset to the high level (Vin+VOR or Vin) of the switch voltage Vsw.

The timer TMR generates a one-shot pulse in a clock signal SC when a predetermined detection period T1 (e.g., 100 μm) elapses after the enable signal EN inputted to the semiconductor device 10 rises to a high level (=logic level at the time of an enabled state). The enable signal EN is a logical signal for switching whether the semiconductor device 10 can be operated or not (enabled/disabled). Further, the enable signal EN also becomes a high level (=logic level at the time of the enabled state), for example, when a normal state is restored after the operation of the protection circuit.

The D flip-flop FF sets a latch signal SD at an output end (Q) to a high level (=high level voltage Vreg at a data end (D)) by using the one-shot pulse of the clock signal SC as a trigger. Further, the D flip-flop FF resets the latch signal SD to a low level (=ground voltage GND1) when the comparison signal SB is at a low level.

The filter FLT raises a filter output signal SE to a high level when the latch signal SD is maintained at a high level over a predetermined mask period T2 (e.g., 5 μm).

The logical product calculator AND performs a logical product calculation on the comparison signal SA and the filter output signal SE, and outputs the result thereof as a detection signal BSPLAT. Therefore, the detection signal BSPLAT becomes a low level (=logic level at the time of non-detecting abnormality) when at least one of the comparison signal SA and the filter output signal SE is at a low level, and the detection signal BSPLAT becomes a high level (=logical level at the time of detecting abnormality) when both the comparison signal SA and the filter output signal SE are at a high level.

The timer TMR, the D flip-flop FF, the filter FLT, and the logical product calculator AND described above function as a logic part configured to generate the detection signal BSPLAT according to both the comparison signals SA and SB. However, the configuration of the logic unit is not limited thereto and may have any variation.

The drain of the transistor M3 is connected to the switch terminal SW. The gate of the transistor M3 is connected to an application end of a bias voltage Vb (e.g., 5 V). The source of the transistor M3 is connected to a first end of the resistor R1. The transistor M3 connected in this way functions as a clamp element that limits the voltage applied to the first end of the resistor R1 to a predetermined upper limit value (Vb−Vgs) or less.

A second end of the resistor R1 and a first end of each of the resistor R2 and the capacitor C1 are both connected to a non-inverting input end (+) of the comparator CMPA. A second end of each of the resistor R2 and the capacitor C1 is connected to the ground end GND1. The resistors R1 and R2 and the capacitor C1 connected in this way function as a voltage divider circuit that divides the switch voltage Vsw to generate a divided voltage Vdiv.

Figure 6:
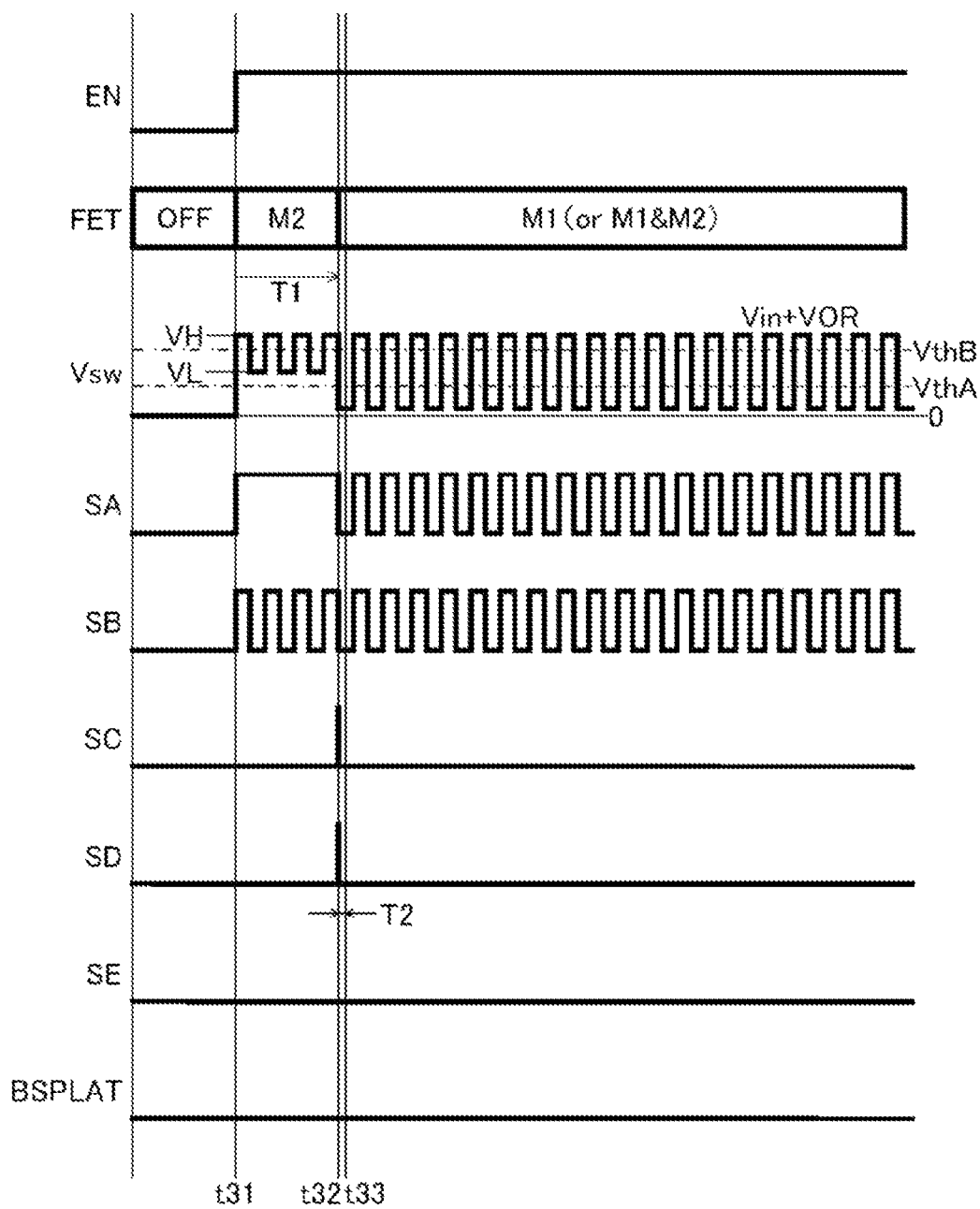
FIG. 6 shows a first example (normal time) of a short-circuit detection operation in the third embodiment.

FIG. 6 is a timing chart showing a first example (=when the switch terminal SW is in a normal state) of a short-circuit detection operation in the third embodiment. In FIG. 6, the enable signal EN, the pulse-drive target FET of the output switch 11, the switch voltage Vsw, the comparison signals SA and SB, the clock signal SC, the latch signal SD, the filter output signal SE, and the detection signal BSPLAT are depicted sequentially from above.

When the enable signal EN of the semiconductor device 10 is raised to a high level at time t31, a short-circuit detection operation of the switch terminal SW is performed over a predetermined detection period T1 (=t31 to t32). With reference to this figures, only the transistor M2 is pulse-driven while the transistor M1 is turned off in the above-mentioned short-circuit detection operation. That is, during the short-circuit detection operation of the switch terminal SW, the output switch 11 is turned on and off while being set to the second on-resistance value (=Ron2).

At this time, if there is no short-circuit abnormality of the switch terminal SW (=short-circuit between both ends of the primary winding 21), according to the on/off state of the output switch 11, the switch voltage Vsw fluctuates up and down between a high level VH (=Vin+VOR) and a low level VL (=Vin×Ron2/(DCR+Ron2)).

Therefore, by setting the threshold voltages VthA and VthB in advance so that VthA<VL<VthB<VH, when the switch terminal SW is in the normal state, the comparison signal SA is fixed at a high level while the comparison signal SB is in a state of periodically repeating the high level and the low level.

When a one-shot pulse is generated in the clock signal SC at time t32 after the detection period T1 elapses, the latch signal SD is set to a high level by using the generation of the one-shot pulse as a trigger. However, when the switch terminal SW is in the normal state, the comparison signal SB periodically falls to a low level as described above. Accordingly, the latch signal SD is reset to the low level without waiting for the lapse of the mask period T2 (=time t32 to t33). As a result, since the filter output signal SE is maintained at a low level, the detection signal BSPLAT also remains at a low level. Therefore, the controller 12 can determine that the switch terminal SW is in the normal state by detecting that the detection signal BSPLAT is maintained at a low level.

If a short-circuit abnormality of the switch terminal SW is not detected, the normal operation of the semiconductor device 10 is started at time t33, and the transistor M1 (or both the transistors M1 and M2) is pulse-driven. That is, during the normal operation of the semiconductor device 10, the output switch 11 is turned on and off while being set to the first on-resistance value (=Ron1 or Ron1//Ron2).

Figure 7:
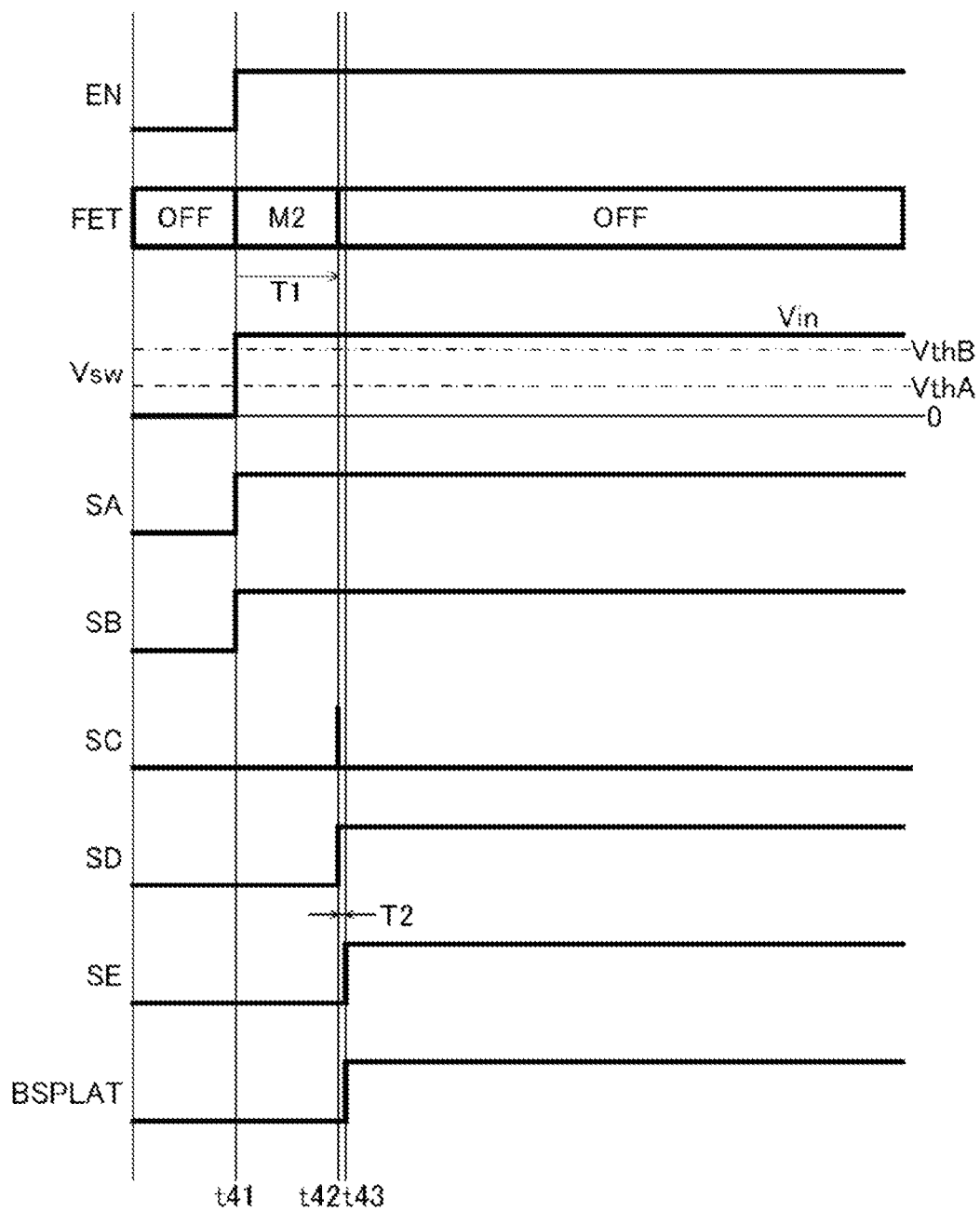
FIG. 7 shows a second example (abnormal time) of a short-circuit detection operation in the third embodiment.

FIG. 7 is a timing chart showing a second example (=when the switch terminal SW is an abnormal state) of a short-circuit detection operation in the third embodiment. In FIG. 7, as in FIG. 6 described above, the enable signal EN, the pulse-drive target FET of the output switch 11, the switch voltage Vsw, the comparison signals SA and SB, the clock signal SC, the latch signal SD, the filter output signal SE, and the detection signal BSPLAT are depicted sequentially from above.

When the enable signal EN of the semiconductor device 10 is raised to a high level at time t41, a short-circuit detection operation of the switch terminal SW is performed over a predetermined detection period T1 (=t41 to t42). In the short-circuit detection operation as described above, only the transistor M2 is pulse-driven while the transistor M1 is turned off. That is, during the short-circuit detection operation of the switch terminal SW, the output switch 11 is turned on and off while being set to the second on-resistance value (=Ron2).

At this time, if a short-circuit abnormality of the switch terminal SW (=short-circuit between both ends of the primary winding 21) occurs, the switch voltage Vsw is substantially fixed to the DC input voltage Vin regardless of whether the output switch 11 is turned on or off. Therefore, when the switch terminal SW is in the abnormal state, both the comparison signals SA and SB are fixed at a high level.

When a one-shot pulse is generated in the clock signal SC at time t42 after the detection period T1 elapses, the latch signal SD is set to a high level by using the generation of the one-shot pulse as a trigger. When the switch terminal SW is in the abnormal state, the comparison signal SB is fixed at a high level as described above. Accordingly, the latch signal SD is maintained at a high level over a mask period T2 (=time t42 to t43) without being reset.

As a result, at time t43 after the lapse of the mask period T2, the filter output signal SE rises to a high level. At this time, since the comparison signal SA is also fixed at a high level, the detection signal BSPLAT rises to a high level. Therefore, the controller 12 can determine the abnormality of the switch terminal SW by detecting the rise of the detection signal BSPLAT.

As described above, in the detection circuit 13 of the present embodiment, when both the comparison signals SA and SB are fixed to one logic level (here, the high level), i.e., when the switch terminal SW is shorted, for example, to an operating voltage of a power supply, and is not pulse-driven normally, a short-circuit abnormality of the switch terminal SW is detected.

During the short-circuit detection operation, the primary current Ip flows directly from the application end of the DC input voltage Vin toward the output switch 11. However, since the on-resistance value of the output switch 11 is higher than that during the normal operation, it is possible to reduce the power consumption (as a result, the heating amount) in the output switch 11.

Further, when the short-circuit abnormality of the switch terminal SW is detected, at time t43 after the detection period T1 (+the mask period T2) expires, the pulse-drive of the output switch 11 is forcibly stopped without starting the normal operation of the semiconductor device 10. Since the excessive primary current Ip can be cut off, it is possible to enhance the safety of the semiconductor device 10. These points are not different from those of the second embodiment (FIG. 2) described above.

In the above-described embodiment, there has been described the example in which the detection period T1 is set when the electric power s supplied to the semiconductor device 10 or when the enable signal EN is inputted. However, the detection period T1 may be set when any trigger is inputted. For example, the detection period T1 can be set during the operation of the isolated switching power supply 1 (such as the standby period for the purpose of power saving) as long as the output operation of the isolated switching power supply 1 is not hindered.

<Application to Vehicle>

Figure 8:
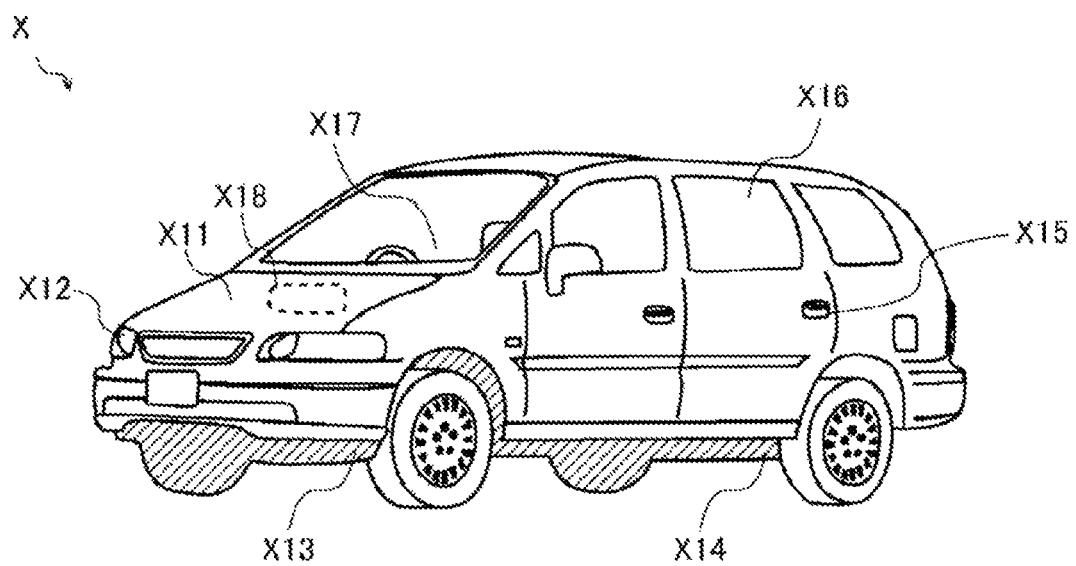
FIG. 8 shows an appearance of a vehicle.

FIG. 8 shows an appearance of a vehicle equipped with electronic devices. A vehicle X of this configuration example is equipped with various electronic devices X11 to X18 that operate by receiving electric power from a battery (not shown). Mounting positions of the electronic devices X11 to X18 in this figure are provided for the convenience of illustration and may differ from actual mounting positions.

The electronic device X11 is an engine control unit that performs control related to an engine (injection control, electronic throttle control, idling control, oxygen sensor heater control, auto cruise control, etc.).

The electronic device X12 is a lamp control unit that controls on/off operations of an HID (High Intensity Discharged) lamp, a DRL (daytime running lamp), or the like.

The electronic device X13 is a transmission control unit that performs control related to a transmission.

The electronic device X14 is a braking unit that performs controls related to movement of the vehicle X (ABS (anti-lock brake system) control, EPS (electric power steering) control, electronic suspension control, etc.).

The electronic device X15 is a security control unit that controls driving of a door lock, a security alarm, or the like.

The electronic device X16 is an electronic device incorporated in the vehicle X at the factory shipment stage as a standard equipment or a manufacturer's option, such as a wiper, an electric door mirror, a power window, a damper (shock absorber), an electric sunroof, an electric seat, or the like.

The electronic device X17 is an electronic device that is optionally mounted on the vehicle X as a user option, such as an in-vehicle A/V (audio/visual) device, a car navigation system, an ETC (electronic toll collection system), or the like.

The electronic device X18 is an electronic device provided with a high withstand voltage motor, such as an in-vehicle blower, an oil pump, a water pump, a battery cooling fan, or the like.

The above-described isolated switching power supply 1 may be incorporated into any of the electronic devices X11 to X18.

<Other Modifications>

In addition to the above-described embodiments, various technical features disclosed in the subject specification may be modified in various ways without departing from the spirit of the technical creation. That is, it should be noted that the above-described embodiments are exemplary in all respects and are not limitative. The technical scope of the present disclosure is not limited to the above-described embodiments. It should be understood that the technical scope of the present disclosure encompasses all changes having the meaning equivalent to the claims and belonging to the claims.

According to the present disclosure in some embodiments, it is possible to provide a highly safe semiconductor device and an isolated switching power supply using the same.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
a switch terminal;
a ground terminal;
an output switch connected between the switch terminal and the ground terminal and configured to be switchable between a first on-resistance value and a second on-resistance value higher than the first on-resistance value;
a detection circuit configured to detect a short-circuit abnormality of the switch terminal by monitoring a switch voltage that appears at the switch terminal in a predetermined detection period; and
a controller configured to:
perform a pulse-drive of the output switch by setting the output switch to the second on-resistance value in the detection period;
continuously perform the pulse-drive of the output switch by setting the output switch to the first on-resistance value if the short-circuit abnormality of the switch terminal is not detected; and
forcibly stop the pulse-drive of the output switch if the short-circuit abnormality of the switch terminal is detected.

2. The semiconductor device of claim 1, wherein the detection period is set when electric power is supplied to the semiconductor device or when a predetermined trigger is inputted.

3. The semiconductor device of claim 1, wherein the output switch is formed by connecting a plurality of transistors in parallel.

4. The semiconductor device of claim 1, wherein the detection circuit includes a comparator configured to generate a detection signal by comparing the switch voltage or a voltage corresponding thereto with a predetermined threshold voltage.

5. The semiconductor device of claim 4, wherein the short-circuit abnormality of the switch terminal is detected when a logic level of the detection signal is fixed to one logic level.

6. The semiconductor device of claim 1, wherein the detection circuit includes:
a first comparator configured to generate a first comparison signal by comparing the switch voltage or a voltage corresponding thereto with a first threshold voltage;
a second comparator configured to generate a second comparison signal by comparing the switch voltage or a voltage corresponding thereto with a second threshold voltage higher than the first threshold voltage; and
a logic part configured to generate a detection signal according to both the first comparison signal and the second comparison signal.

7. The semiconductor device of claim 6, wherein the short-circuit abnormality of the switch terminal is detected when both the first comparison signal and the second comparison signal are fixed to one logic level.

8. The semiconductor device of claim 6, wherein the first threshold voltage is generated by giving a positive offset to a low level of the switch voltage, and the second threshold voltage is generated by giving a negative offset to a high level of the switch voltage.

9. An isolated switching power supply, comprising:
the semiconductor device of claim 1;
a transformer configured such that a primary winding of the transformer is connected in series between an application end of a DC input voltage and the switch terminal of the semiconductor device; and
a rectifying/smoothing circuit configured to generate a DC output voltage by rectifying and smoothing an induced voltage appearing in a secondary winding of the transformer.

10. A vehicle comprising the isolated switching power supply of claim 9.

* * * * *